United States Patent
Kim et al.

(10) Patent No.: US 11,067,801 B2
(45) Date of Patent: Jul. 20, 2021

(54) HEAD-MOUNTED DISPLAY DEVICE

(71) Applicant: Samsung Display Co., Ltd., Yongin-si (KR)

(72) Inventors: Wal Jun Kim, Hwaseong-si (KR); Jin Yeong Kim, Hwaseong-si (KR); Ki Wan Ahn, Seoul (KR); Joo Sun Yoon, Seoul (KR); Yong Jae Jang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 268 days.

(21) Appl. No.: 16/135,486

(22) Filed: Sep. 19, 2018

(65) Prior Publication Data
US 2019/0086671 A1 Mar. 21, 2019

(30) Foreign Application Priority Data
Sep. 20, 2017 (KR) ........................ 10-2017-0121342

(51) Int. Cl.
| | |
|---|---|
| G02B 27/14 | (2006.01) |
| G02B 27/01 | (2006.01) |
| G02B 5/30 | (2006.01) |
| H01L 51/52 | (2006.01) |
| G02B 17/00 | (2006.01) |
| G02B 27/28 | (2006.01) |

(52) U.S. Cl.
CPC ....... *G02B 27/0172* (2013.01); *G02B 5/3058* (2013.01); *G02B 17/002* (2013.01); *G02B 27/283* (2013.01); *H01L 51/5253* (2013.01); *H01L 51/5271* (2013.01); *H01L 51/5275* (2013.01); *G02B 2027/0178* (2013.01)

(58) Field of Classification Search
CPC ........ G02B 27/0172; G02B 2027/0178; G02B 5/3025; G02B 5/3016; G02B 5/3058; G02B 5/305; H01L 51/5237; H01L 51/5253; H01L 51/5275; H01L 51/5271
See application file for complete search history.

(56) References Cited

U.S. PATENT DOCUMENTS

| | | | |
|---|---|---|---|
| 5,526,184 A | 6/1996 | Tokuhashi et al. | |
| 10,520,734 B1* | 12/2019 | Chan | G02B 27/28 |
| 2013/0044282 A1* | 2/2013 | Kuwahara | G02F 1/1333 349/96 |
| 2014/0183342 A1* | 7/2014 | Shedletsky | H01L 51/5012 250/215 |
| 2017/0040408 A1 | 2/2017 | Choi et al. | |

FOREIGN PATENT DOCUMENTS

| | | |
|---|---|---|
| JP | 3260867 | 2/2002 |
| KR | 10-0841246 | 6/2008 |
| KR | 10-1689035 | 12/2016 |

* cited by examiner

*Primary Examiner* — Alicia M Harrington
(74) *Attorney, Agent, or Firm* — H.C. Park & Associates, PLC

(57) ABSTRACT

A head-mounted display device includes a display including a substrate and a plurality of display elements disposed on the substrate, a first polarizing layer disposed on the display, a reflective layer disposed on the first polarizing layer, a light-separating layer disposed on the reflective layer, a lens disposed on the light-separating layer, and a second polarizing layer disposed on the lens.

17 Claims, 13 Drawing Sheets

HEAD-MOUNTED DISPLAY DEVICE

CROSS-REFERENCE TO RELATED APPLICATION

This application claims priority from Korean Patent Application No. 10-2017-0121342 filed on Sep. 20, 2017, which is hereby incorporated by reference for all purposes as if fully set forth herein.

BACKGROUND

Field

The present disclosure relates to a head-mounted display device.

Discussion of the Background

Display devices become more and more important as multimedia technology evolves. Accordingly, a variety of types of display devices such as liquid-crystal display (LCD) devices and organic light-emitting display (OLED) devices are currently used.

Among display devices, an LCD device is one of the most broadly used flat panel display devices. An LCD device is composed of two substrates on which electrodes for generating electric field such as pixel electrodes and common electrodes are formed, and a liquid-crystal layer interposed between the two substrates. To display images, voltage is applied to the electrodes to form an electric field in the liquid-crystal layer in order to align the orientation of the liquid crystals contained in the liquid-crystal layer and to control the polarization of incident light.

OLED devices are also becoming popular since they do not use backlights. An organic light-emitting display device displays images by using organic light-emitting diodes (OLEDs) that utilize the phenomenon that holes and electrons recombine to generate light. Such an organic light-emitting display device has advantages in that it has fast response speed, high luminance and large viewing angle, and low power consumption.

A head-mounted display device may be mounted on a user's head and may have the form of a pair of glasses or a helmet. Such a head-mounted display device displays an image in front of the user's eyes so that the user can recognize the image.

The above information disclosed in this Background section is only for understanding of the background of the inventive concepts, and, therefore, it may contain information that does not constitute prior art.

SUMMARY

Exemplary embodiments of the invention may provide a head-mounted display device capable of reducing a focal length.

Exemplary embodiments also may provide a head-mounted display device with reduced thickness and improved portability.

According to exemplary embodiments, the focal length can be reduced. In addition, the thickness of a head-mounted display device can be reduced while improving portability.

An exemplary embodiment includes a head-mounted display device including a display including a substrate and a plurality of display elements disposed on the substrate, a first polarizing layer disposed on the display; a reflective layer disposed on the first polarizing layer, a light-separating layer disposed on the reflective layer, a lens disposed on the light-separating layer, and a second polarizing layer disposed on the lens.

An exemplary embodiment also includes a head-mounted display device including a display including a substrate and a plurality of display elements disposed on the substrate, a first polarizing layer disposed on the display, a reflective layer disposed on the first polarizing layer, and an optical unit including a light-separating layer disposed on the reflective layer, a lens disposed on the light-separating layer, and a second polarizing layer disposed on the lens. At least one of the light-separating layer and the second polarizing layer may be in direct contact with the lens.

Additional features of the inventive concepts will be set forth in the description which follows, and in part will be apparent from the description, or may be learned by practice of the inventive concepts.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
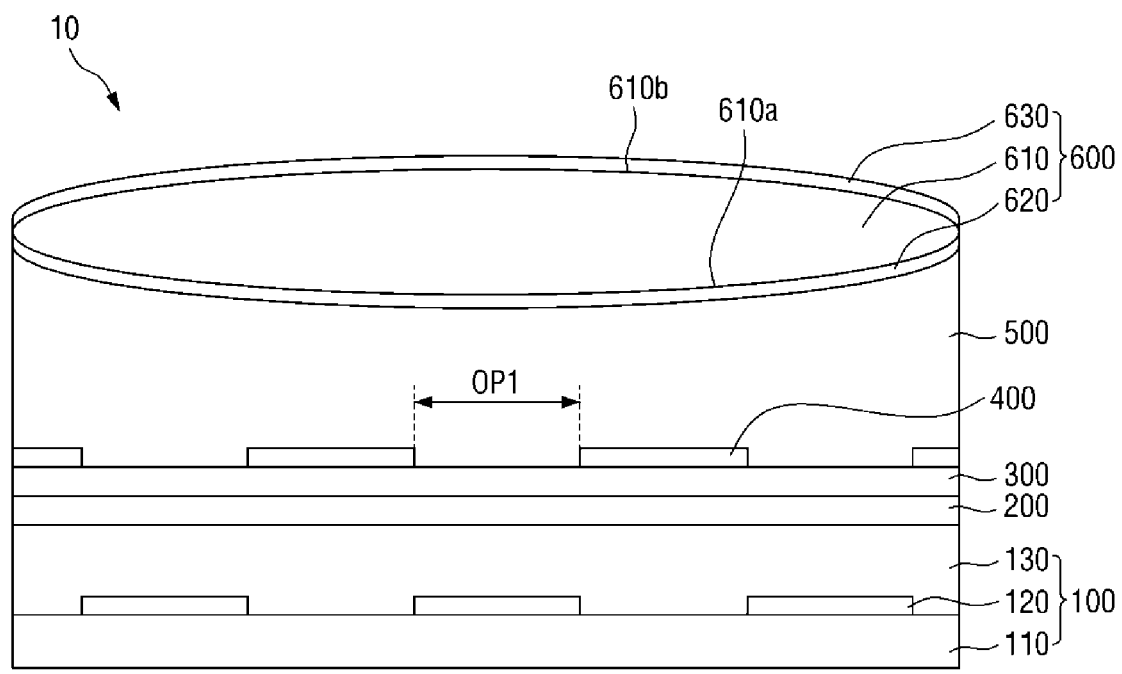
FIG. 1 is a cross-sectional view of a head-mounted display device according to an exemplary embodiment of the present invention.
Figure 1:
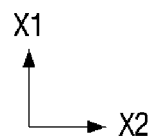

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, exemplary embodiments will be described with reference to the accompanying drawings.

FIG. 1 is a cross-sectional view of a head-mounted display device according to an exemplary embodiment.

Referring to FIG. 1, a head-mounted display device 10 may include a display 100, a first polarizing layer 200, a first buffer layer 300, a reflective layer 400, an adhesive layer 500 and an optical unit 600.

The display 100 may display images. The display 100 may include a first substrate 110, a plurality of display elements 120, and a protective layer 130.

The first substrate 110 may be an insulating substrate. In an exemplary embodiment, the first substrate 110 may include a material such as glass, quartz, and a polymer. The polymer material may be polyethersulphone (PES), polyacrylate (PA), polyacrylate (PAR), polyetherimide (PEI), polyethylenenapthalate (PEN), polyethyleneterepthalate (PET), polyphenylenesulfide (PPS), polyallylate, polyimide (PI), polycarbonate (PC), cellulosetriacetate (CAT), cellulose acetate propionate (CAP), or combinations thereof. In another exemplary embodiment, the first substrate 110 may be a flexible substrate including polyimide (PI).

The plurality of display elements 120 may be disposed on the first substrate 110. The plurality of display elements 120 emits light in a first direction X1. That is, the optical unit 600 may be disposed on the path of the light that is emitted from the plurality of display elements 120. The plurality of display elements 120 may be arranged in a second direction X2 such that they are spaced apart from one another by at a predetermined distance. The plurality of display elements 120 may include organic light-emitting elements, liquid-crystal display elements, light-emitting diodes (LEDs), electroluminescent elements, semiconductor light-emitting elements, field emission display (FED) elements, and quantum dot display elements. In the following description, organic light-emitting elements will be described as an example of the plurality of display elements 120. A plurality of elements included in the display 100 will be described later with reference to FIGS. 2 and 3.

The protective layer 130 may be disposed over the plurality of display elements 120. The protective layer 130 may prevent external air, foreign matter or the like from being introduced into the plurality of display elements 120. The material of the protective layer 130 is not particularly limited herein. The protective layer 130 may include an inorganic material or an organic material, for example. The protective layer 130 may be eliminated or replaced with another element (e.g., an insulating layer). Since the display elements 120 are organic light-emitting elements as described above, the protective layer 130 may be an encapsulation layer for encapsulating the organic light-emitting elements.

The first polarizing layer 200 may be disposed on the display 100. More specifically, the first polarizing layer 200 may be disposed between the display 100 and the optical unit 600, and may be located on the path of the light that is emitted from the plurality of display elements 120. The first polarizing layer 200 may polarize the light emitted from the plurality of display elements 120 in a particular direction. Hereinafter, the first polarized light is defined as light polarized in a particular direction by the first polarizing layer 200.

The first polarized light may be, for example, linearly polarized light, circularly polarized light, or elliptically polarized light. The linearly polarized light is an electromagnetic wave that oscillates in the direction perpendicular to its traveling direction and has a constant amplitude. The circularly polarized light is an electromagnetic wave that oscillates in the direction perpendicular to its traveling direction while rotating and has a constant amplitude. The circularly polarized light is an electromagnetic wave that oscillates in the direction perpendicular to its traveling direction while rotating elliptically and has a varying amplitude.

Unlike that shown in FIG. 1, the first polarizing layer 200 may be coupled with the display 100 by an additional adhesive member. The type of the adhesive member is not particularly limited herein. The adhesive member may be, for example, an optically transparent adhesive member (an optically clear adhesive (OCA) or an optically clear resin (OCR)) or a pressure sensitive adhesive member (PSA).

The first buffer layer 300 may be disposed on the first polarizing layer 200. The material of the first buffer layer 300 is not particularly limited herein. For example, the first buffer layer 300 may include an inorganic material or an organic material. Alternatively, the first buffer layer 300 may have a single-layer structure of an organic layer or an inorganic layer or may have a multi-layer structure of organic layers and inorganic layers stacked on one another. The first buffer layer 300 may also be eliminated.

The reflective layer 400 may be disposed on the first buffer layer 300. The reflective layer 400 may reflect the light incident thereon toward the optical unit 600. More specifically, the reflective layer 400 may change the phase of the light incident thereon. For example, some of the first polarized light having passed through the first polarizing layer 200 is reflected off the light-separating layer 620, which will be described below, and then is incident on the reflective layer 400. The reflective layer 400 may reflect the light having its phase changed back to the optical unit 600. To this end, the reflective layer 400 may include a phase retarder that changes the phase of the light incident on the reflective layer 400, and a reflective mirror that provides the light having its phase changed to the optical unit 600.

According to an exemplary embodiment, the reflective layer 400 may be formed on the entire surface of the first buffer layer 300, except a plurality of first openings OP1. This will be described later with reference to FIG. 2.

The adhesive layer 500 may be disposed over the reflective layer 400. More specifically, the adhesive layer 500 may be disposed between the reflective layer 400 and the optical unit 600 to couple them together. The adhesive layer 500 may be, for example, an optically transparent adhesive member (OCA or OCR). The thickness of the adhesive layer 500 is not particularly limited as long as a sufficient distance can be obtained between the optical unit 600 and the display 100. The adhesive layer 500 may be eliminated. If there is no adhesive layer, the head-mounted display device 10 may include an additional fixing member for fixing the optical unit 600 on the reflective layer 400. In the following description, it is assumed that the reflective layer 400 is coupled with the optical unit 600 by the adhesive layer 500.

The optical unit 600 may be disposed on the adhesive layer 500. The optical unit 600 may include a lens 610, a light-separating layer 620, and a second polarizing layer 630.

The lens 610 is disposed on the path of the light that exits from the display 100 and may converge the received light on a predetermined area. Specifically, the lens 610 may be disposed between the display 100 and a user's eyes to converge the light exiting from the display 100 on the user's eyes. According to an exemplary embodiment, the lens 610 may be an opaque lens in order to realize a virtual reality experience. According to another exemplary embodiment, the lens 610 may be a transparent lens or a translucent lens in order to realize an augmented reality experience. For example, the lens 610 may be a convex lens. In addition, the lens 610 may be, but is not limited to, a single positive lens. That is, the type, shape, number and the like of the lens 610 are not particularly limited herein as long as the light exiting from the display 100 can be converged on the user's eyes.

The lens 610 may include a first surface 610a and a second surface 610b opposed to it. The light-separating layer 620 may be disposed on the first surface 610a of the lens 610. The second polarizing layer 630 may be disposed on the second surface 610b of the lens 610.

The light-separating layer 620 will be described first. For example, the light-separating layer 620 may be formed on and along the first surface 610a of the lens 610. The light-separating layer 620 may be formed on the first surface 610a of the lens 610 in a variety of manners. For example, the light-separating layer 620 may be formed on the first surface 610a of the lens 610 by coating.

The light-separating layer 620 may transmit some of the first polarized light that has passed through the first polarizing layer 200 and reflect the remainder of the light. The light having passed through the light-separating layer 620 may be provided to the second polarizing layer 630 through the lens 610. On the other hand, the light reflected by the light-separating layer 620 may be provided back to the reflective layer 400.

For example, the second polarizing layer 630 may be formed on and along the second surface 610b of the lens 610. The second polarizing layer 630 may be formed on the second surface 610b of the lens 610 in a variety of manners. For example, the second polarizing layer 630 may be formed on the second surface 610b of the lens 610 by coating.

The second polarizing layer 630 transmits some of the light having passed through the light-separating layer 620 and blocks the rest of the light. More specifically, after the first polarized light is reflected off the light-separating layer 620, the phase of the reflected light is changed by the reflective layer 400, then the light can transmit through the light-separating layer 620. The second polarizing layer 630 transmits only the light having passed through the light-separating layer 620. On the contrary, the second polarizing layer 630 blocks light that transmits through the light-separating layer 620 with no phase change (i.e., the first polarized light).

The optical path of the light from the display 100 to the user's eyes will be described later in more detail with reference to FIG. 4.

Hereinafter, the display 100, the first polarizing layer 200, and the reflective layer 400 will be described in more detail with reference to FIGS. 2 and 3.

Figure 2:
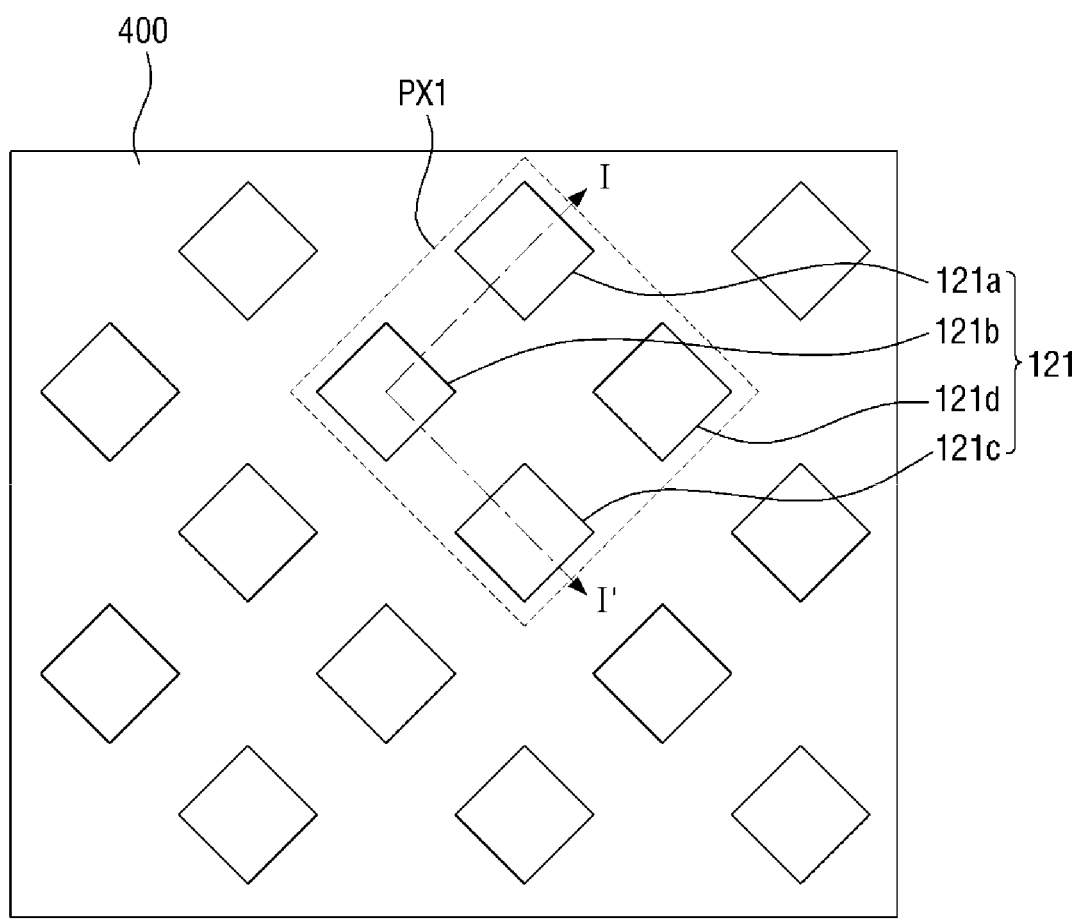
FIG. 2 is a plan view for illustrating the display and the reflective layer in detail among the elements shown in FIG. 1.

FIG. 2 is a plan view for illustrating the display, the first polarizing layer and the reflective layer in detail among the elements shown in FIG. 1. FIG. 3 is a cross-sectional view taken along line I-I' shown in FIG. 2. It is to be noted that the first polarizing layer 200 is not depicted in FIG. 2 for convenience of illustration. Hereinafter, the plurality of display elements 120 (see FIG. 1) is referred to as a plurality of organic light-emitting elements 121, and the protective layer 130 (see FIG. 1) is referred to as an encapsulation layer 131.

Figure 3:
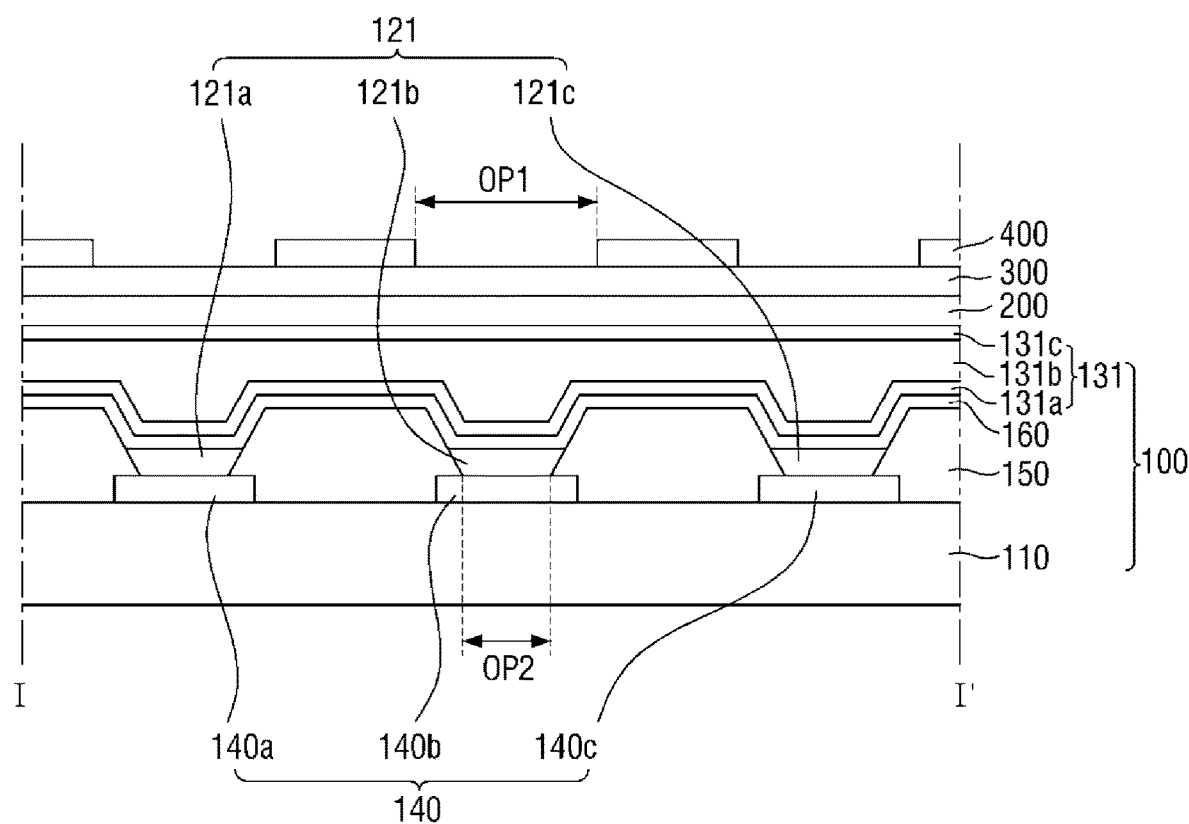
FIG. 3 is a cross-sectional view taken along line I-I' shown in FIG. 2.

Referring to FIGS. 2 and 3, the display 100 may include a first substrate 110, a plurality of organic light-emitting elements 121, an encapsulation layer 131, a plurality of pixel electrodes 140, an isolation layer 150, and a common electrode 160.

The plurality of pixel electrodes 140 may be disposed on the first substrate 110. Although not shown in the drawings, a plurality of elements may be further disposed between the first substrate 110 and the plurality of pixel electrodes 140. For example, the elements may include a buffer layer, a plurality of conductive wirings, an insulating layer, a plurality of thin-film transistors, etc. The plurality of thin-film transistors may use amorphous silicon, polysilicon, low-temperature polysilicon (LTPS), oxide semiconductor, organic semiconductor or the like as a channel layer. The types of channel layers of the plurality of thin-film transistors may be different from each other. According to an exemplary embodiment, a thin-film transistor including an oxide semiconductor and a thin-film transistor including a low-temperature polysilicon may be included in one pixel unit, taking into account the functionality of the thin-film transistors or the processing sequence.

First, second, and third pixel electrodes 140a, 140b, and 140c will be described as an example of the plurality of pixel electrodes 140. The first, second, and third pixel electrodes 140a, 140b, and 140c may be anode electrodes, for example. When the first, second, and third pixel electrodes 140a, 140b, and 140c are anode electrodes, the first, second, and third pixel electrodes 140a, 140b, and 140c may include a reflective material. The reflective material may include, for example, a reflective layer made of at least one selected from the group consisting of silver (Ag), magnesium (Mg), chromium (Cr), gold (Au), platinum (Pt), nickel (Ni), copper (Cu), tungsten (W) and aluminum (Al). The reflective material may include a transparent or translucent electrode formed on the reflective layer.

The transparent or translucent electrode may be made of at least one selected from the group consisting of indium tin oxide (ITO), indium zinc oxide (IZO), zinc oxide (ZnO), Indium Oxide ($In_2O_3$), indium gallium oxide (IGO), and aluminum zinc oxide (AZO).

The isolation layer 150 may be disposed on the first, second, and third pixel electrodes 140a, 140b, and 140c. The isolation layer 150 includes second openings OP2 via which at least a part of the first pixel electrode 140a, at least a part of the second pixel electrode 140b, and at least a part of the third pixel electrode 140c are exposed. The isolation layer 150 may include an organic material or an inorganic material. For example, the isolation layer 150 may include a material such as a photoresist, a polyimide resin, an acrylic resin, a silicon compound, and a polyacrylic resin.

The shape of the first, second, and third pixel electrodes 140a, 140b, and 140c and the shape of the second openings OP2 of the isolation layer 150 may be, for example, a diamond shape or a square shape. As used herein, the term a diamond shape encompasses not only a diamond shape but also a simple geometric shape approximating a diamond shape under different processing conditions. It is, however, to be understood that the shape of the first, second, and third pixel electrodes 140a, 140b, 140c and the shape of the second openings OP2 of the isolation layer 150 are not limited to those shown in FIGS. 2 and 3 and may vary depending on the arrangement of the plurality of pixel units.

The plurality of organic light-emitting elements 121 may be disposed on the plurality of pixel electrodes 140 and the isolation layer 150. First, second, third, and fourth organic light-emitting elements 121a, 121b, 121c, and 121d will be described as one example of a plurality of organic light-emitting elements 121.

According to an exemplary embodiment, the first organic light-emitting element 121a may emit red light. The second organic light-emitting element 121b and the fourth organic light-emitting element 121d may emit green light. The third organic light-emitting element 121c may emit blue light. The wavelength of the red light may range from approximately 620 to 750 nm, and the wavelength of the green light may range from approximately 495 to 570 nm. Further, the wavelength of the blue light may range from approximately 450 to 495 nm.

According to another exemplary embodiment, the first, second, third, and fourth organic light-emitting elements 121a, 121b, 121c, and 121d may emit white light. When the first, second, third, and fourth organic light-emitting elements 121a, 121b, 121c, and 121d emit white light, a red emission layer, a green emission layer or a blue emission layer may be stacked on each of them, for example. In addition, additional color filters for displaying red, green and blue colors, respectively, may be further included.

According to an exemplary embodiment, the first, second, third, and fourth organic light-emitting elements 121a, 121b, 121c, and 121d may be included in one pixel unit PX1. Specifically, the pixel unit PX1 may include organic light-emitting elements emitting red, green, blue, and green (RGBG) light beams, respectively. It is to be understood that the number, arrangement, and color of the organic light-emitting elements included in the pixel unit PX1 are not limited to those shown in FIG. 2.

The first, second, and third organic light-emitting elements 121a, 121b, and 121c may be disposed on a part of the first pixel electrode 140a, a part of the second pixel electrode 140b, and a part of the third pixel electrode 140c exposed through the second openings OP2 of the isolation layer 150, respectively. The fourth organic light-emitting element 121d may be disposed on a part of the fourth pixel electrode (not shown). The first, second, third, and fourth organic light-emitting elements 121a, 121b, 121c, and 121d may overlap the second openings OP2 of the isolation layer 150, respectively. According to an exemplary embodiment, each of the first, second, third, and fourth organic light-emitting elements 121a, 121b, 121c, and 121d may overlap at least a part of the respective second openings OP2 of the isolation layer 150. Accordingly, the first, second, third, and fourth organic light-emitting elements 121a, 121b, 121c, and 121d may have a diamond shape conforming to the shape of the second openings OP2 of the isolation layer 150 when viewed from the top.

The common electrode 160 may be disposed on the organic light-emitting elements 121 and the isolation layer 150. According to an exemplary embodiment, the common electrode 160 may be formed throughout the plurality of organic light-emitting elements 121 and the isolation layer 150. In an exemplary embodiment, the common electrode 160 may be a cathode electrode. In an exemplary embodiment, the common electrode 160 may include at least one selected from the group consisting of Li, Ca, LiF/Ca, LiF/Al, Al, Ag and Mg. In addition, the common electrode 160 may be made of a metal thin film having a low work function. In an exemplary embodiment, the common electrode 160 may be made of at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

Although not shown in the drawings, a capping layer may be disposed on the common electrode 160. The capping layer can prevent light incident on the common electrode 160 from being lost by total reflection. The capping layer may be made of an organic layer or an inorganic layer.

The encapsulation layer 131 may be disposed on the common electrode 160. More specifically, the encapsulation layer 131 may be disposed above the first substrate 110 so that it covers the plurality of organic light-emitting elements 121. That is, the plurality of organic light-emitting elements 121 may be disposed between the first substrate 110 and the encapsulation layer 131. The encapsulation layer 131 can protect the organic light-emitting elements 121 from the external oxygen and moisture.

The encapsulation layer 131 may be made up of a single layer of an organic layer or an inorganic layer or may be made up of multiple layers formed by stacking an organic layer and an inorganic layer. For example, the encapsulation layer 131 may include a first inorganic layer 131a, an organic layer 131b, and a second inorganic layer 131c.

The first inorganic layer 131a may be disposed on the common electrode 160. The first inorganic layer 131a may include at least one selected from the group consisting of silicon oxide (SiOx), silicon nitride (SiNx) and silicon oxynitride (SiONx).

The organic layer 131b may be disposed on the first inorganic layer 131a. The organic layer 131b may include one selected from the group consisting of epoxy, acrylate, and urethane acrylate. The organic layer 131b can provide a flat surface over the level difference created by the isolation layer 150.

The second inorganic layer 131c may be disposed on the organic layer 131b. The second inorganic layer 131c may include at least one selected from the group consisting of silicon oxide (SiOx), silicon nitride (SiNx), and silicon oxynitride (SiONx). In addition, at least one of the first inorganic layer 131a, the organic layer 131b, and the second inorganic layer 131c may be made up of a single layer or multiple layers.

In another exemplary embodiment, the encapsulation layer 131 may include a hexamethyldisiloxane (HMDSO) layer. More specifically, the encapsulation layer 131 may include the first inorganic layer 131a, the second inorganic layer 131c, and the HMDSO layer disposed between the first inorganic layer 131a and the second inorganic layer 131c. That is, the above-described organic layer 131b may be replaced with the HMDSO layer.

In an exemplary embodiment, the HMDSO layer may be formed in the same chamber after forming the first inorganic layer 131a. By doing so, the process of forming the encapsulation layer 131 can become simpler. In addition, as the encapsulation layer 131 includes the HMDSO layer that is capable of absorbing stress, the encapsulation layer 131 can have sufficient flexibility.

The first polarizing layer 200 may be disposed on the encapsulation layer 131. The first buffer layer 300 may be disposed on the first polarizing layer 200. The first buffer layer 300 may also be eliminated.

The reflective layer 400 may be formed on the entire surface of the first buffer layer 300, except for the plurality of first openings OP1. The reflective layer 400 may change the phase of the light incident thereon and then reflect it back to the optical unit 600. As described above, the reflective layer 400 may include, for example, a phase retarder that can retard the phase of light and a reflective mirror that reflects light. The degree of phase retardation by the phase retarder is not particularly limited herein as long as the light can transmit the second polarizing layer 630. For example, the phase retarder can retard the phase of the light provided from the reflective layer 400 by approximately ¼λ.

The first openings OP1 overlap with the organic light-emitting elements 121, respectively. Accordingly, the light having passed through the first polarizing layer 200 may be provided to the optical unit 600 (see FIG. 1) with no phase change. Although a plurality of the organic light-emitting elements 121 are shown as being not overlapped with the reflective layer 400, this is merely illustrative. That is, at least one of the one side and the other side of the plurality of organic light-emitting elements 121 may be overlapped with the reflective layer 400. As used herein, the phase "an element overlaps with another element" means that the two elements are disposed on different layers and at least a part of one element overlaps with or is placed over another in a direction perpendicular to the first substrate 110.

Hereinafter, the optical path will be described with reference to FIG. 4. For convenience of illustration, only the organic light-emitting elements 121 and the encapsulation layer 131 of the display 100 are shown in the drawings. In addition, the elements already described above with respect to FIGS. 1 and 3 will not be described again.

Figure 4:
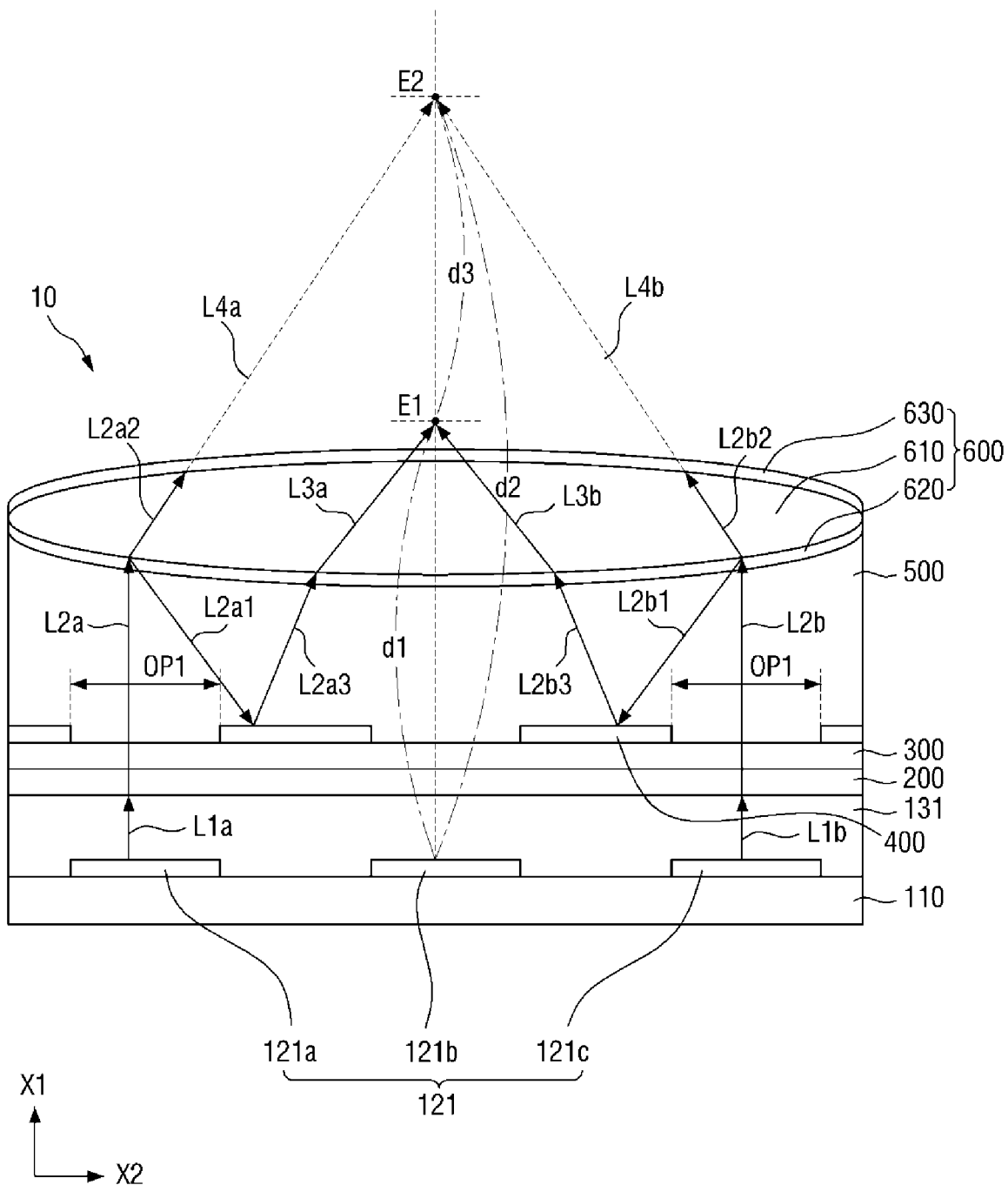
FIG. 4 is a view for illustrating an optical path in a head-mounted display device according to an exemplary embodiment.

FIG. 4 is a view for illustrating an optical path in a head-mounted display device according to an exemplary embodiment.

Initially, the first organic light-emitting element 121a and the third organic light-emitting element 121c may emit first light beams L1a and L1b toward the optical unit 600, respectively. In the following description, the terms first, second, third and the like are used for distinguishing between similar elements and not necessarily for describing a sequential or chronological order.

The first polarizing layer 200 may receive the first light beams L1a and L1b to generate the firstly-polarized light beams L2a and L2b. The first polarized light beams L2a and L2b may be, for example, linearly polarized light, circularly polarized light, or elliptically polarized light.

The first polarized light beams L2a and L2b may pass through the first openings OP1 and may be provided to the optical unit 600, more specifically to the light-separating layer 620.

The light-separating layer 620 may transmit some of the first polarized light beams L2a and L2b and reflect the rest. In the following description, the light beams reflected off the light-separating layer 620 are referred to as first reflected light beams L2a1 and L2b1, and the light beams passing through the light-separating layer 620 are referred to as first transmitted light beams L2a2 and L2b2.

First, the first transmitted light beams L2a2 and L2b2 will be described. The firstly-transmitted light beams L2a2 and L2b2 are refracted by the lens 610 at a predetermined angle. Then, the refracted, first transmitted light beams L2a2 and L2b2 are provided to the second polarizing layer 630. Since the first transmitted light beams L2a2 and L2b2 are polarized in a first direction by the first polarizing layer 200, they cannot exit by the second polarizing layer 630.

On the contrary, the first reflected light beams L2a1 and L2b1 may be reflected off the light-separating layer 620 to be provided to the reflective layer 400. The reflective layer 400 may change the phase of the received first reflected light beams L2a1 and L2b1 and then reflect them back to the optical unit 600. More specifically, the reflective layer 400 may change the phase of the first reflected light beams L2a1 and L2b1 to generate light beams L2a3 and L2b3 polarized in a second direction. The light beams L2a3 and L2b3 polarized in the second direction are provided back to the optical unit 600. The second direction is different from the first direction. The light beam polarized in the second direction refers to a light whose phase has changed so that it can pass through the second polarizing layer 630.

The light beams L2a3 and L2b3 polarized in the second direction are provided to the optical unit 600, more specifically, the light-separating layer 620, such that some of them may be transmitted and the rest may be reflected by the light-separating layer 620. The transmitted light beams are referred to as second reflected light beams L3a and L3b. The second reflected light beams L3a and L3b are provided to the second polarizing layer 630. As described above, the second reflected light beams L3a and L3b have been polarized in the second direction, that is, their phases have been retarded so that they can pass through the second polarizing light layer 630, and thus they can pass through the second polarizing layer 630.

A first focal point E1 is formed by the second reflected light beams L3a and L3b having passed through the second polarizing layer 630. The shortest distance d1 between the first focal point E1 and the second organic light-emitting element 121b is defined as the focal length of the head-mounted display device 10 according to the exemplary embodiment. Hereinafter, the shortest distance between the first focal point E1 and the second organic light-emitting element 121b and the focal length of the head-mounted display device 10 will be denoted by d1. According to an exemplary embodiment, the focal length d1 of the head-mounted display device 10 may be approximately 10 mm or less.

If the first polarizing layer 200, the second polarizing layer 630, the reflective layer 400, and the light-separating layer 620 are not present (as in a head-mounted display device according to a Comparative Example), the lens 610 may receive the first light beams L1a and L1b to refract them at a predetermined angle, thereby generating the second light beams L4a and L4b. As a result, a second focal point E2 can be formed by the second light beams L4a and L4b. The shortest distance between the second focal point E2 and the second organic light-emitting element 121b is defined as the focal length of the head-mounted display device according to Comparative Example. Hereinafter, the shortest distance d2 between the second focal point E2 and the second organic light-emitting element 121b and the focal length of the head-mounted display device according to Comparative Example will be denoted by d2.

Referring to FIG. 4, the focal length d1 of the head-mounted display device 10 according to the exemplary embodiment is shorter than the focal length d2 of the head-mounted display device according to Comparative Example. For example, if the focal length d2 of the head-mounted display device according to Comparative Example is approximately 40 mm, the difference d3 between the two focal lengths may be approximately 30 mm because the focal length of the exemplary embodiment may be 10 mm.

That is, the head-mounted display device 10 according to the exemplary embodiment can reduce the focal length d1 as compared to the head-mounted display device according to Comparative Example. This means that the thickness of the head-mounted display device 10 can be reduced.

Figure 5:
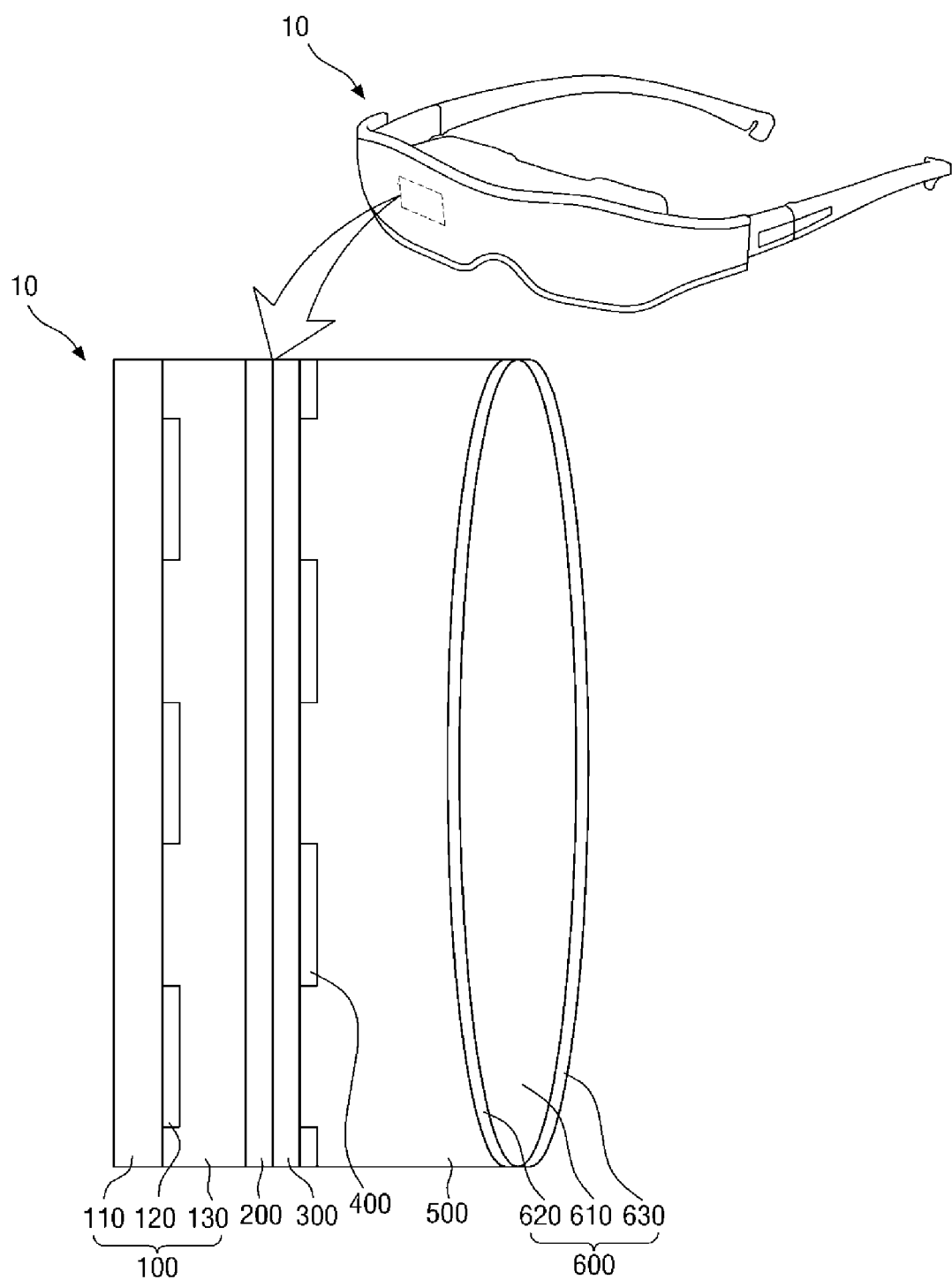
FIG. 5 is a perspective view schematically showing a head-mounted display device according to an exemplary embodiment.

FIG. 5 is a perspective view schematically showing a head-mounted display device according to an exemplary embodiment. The elements already described above with respect to FIGS. 1, 2, 3, and 4 will not be described again.

Referring to FIG. 5, a head-mounted display device 10 according to an exemplary embodiment may include the display 100, the first polarizing layer 200, the first buffer layer 300, the reflective layer 400, the adhesive layer 500 and the optical unit 600.

Although not shown in the drawings, the head-mounted display device 10 according to an exemplary embodiment may further include a camera, an infrared sensor, a signal processor, and a frame that can be mounted on a user's head, etc.

That is, the head-mounted display device 10 according to the exemplary embodiment can reduce the focal distance d1 as described above with reference to FIG. 4, thereby reducing the overall thickness of the head-mounted display device 10.

Figure 6:
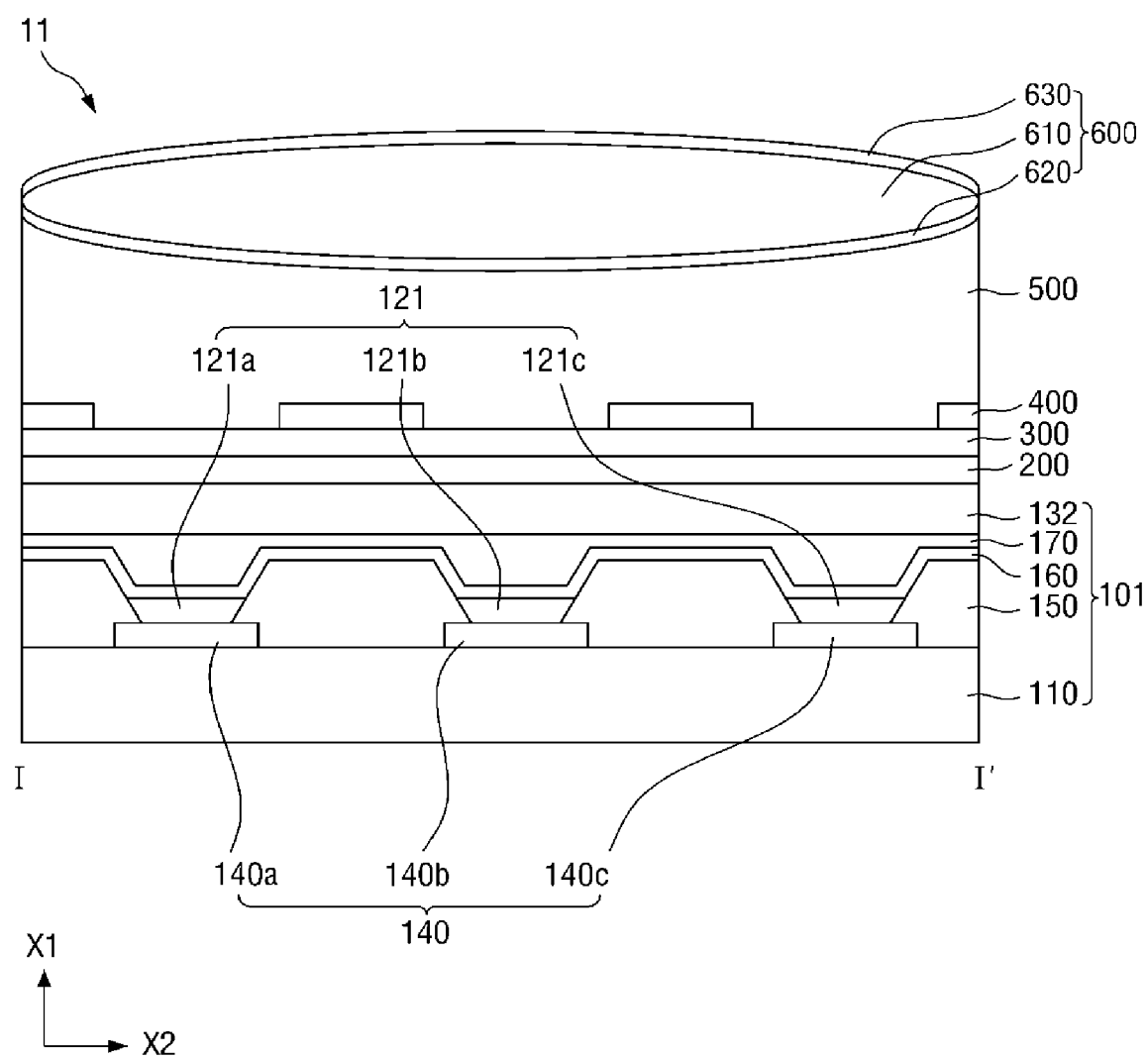
FIG. 6, FIG. 7A, FIG. 7B, FIG. 7C, FIG. 8, FIG. 9, FIG. 10, and FIG. 11 are cross-sectional views of head-mounted display devices according to other exemplary embodiments.

FIG. 6 is a cross-sectional view of a head-mounted display device according to another exemplary embodiment. For convenience of illustration, a head-mounted display device 11 according to this exemplary embodiment will be described with reference to the cross section taken along line I-I' of FIG. 2. The elements already described above with respect to FIGS. 1, 2, 3, 4, and 5 will not be described again.

Referring to FIG. 6, the head-mounted display device 11 according to this exemplary embodiment includes an encapsulation layer 132 implemented as a glass insulating substrate, instead of the encapsulation layer 131 made of a single organic or inorganic layer or multiple layers thereof shown in FIG. 3. In addition, the head-mounted display device 11 may further include a second buffer layer 170 disposed between the encapsulation layer 132 and the common electrode 160.

The encapsulation layer 132 may be a transparent insulating substrate. The encapsulation layer 132 may be, for example, a glass substrate, a quartz substrate, a transparent resin substrate, or the like. A sealing member may be disposed between the encapsulation layer 132 of the transparent insulating substrate and the first substrate 110, in order to attach the encapsulation layer 132 and the first substrate 110 together.

The second buffer layer 170 may be disposed between the common electrode 160 and the encapsulation layer 132. The material of the second buffer layer 170 is not particularly limited herein. For example, the second buffer layer 170 may include an inorganic material or an organic material. Alternatively, the second buffer layer 170 may have a single-layer structure of an organic layer or an inorganic layer or may have a multi-layer structure of organic layers and inorganic layers stacked on one another. The second buffer layer 170 may also be eliminated. The second buffer layer 170 may work as a capping layer that prevents light incident on the common electrode 160 from being lost by total reflection.

Figure 7A:
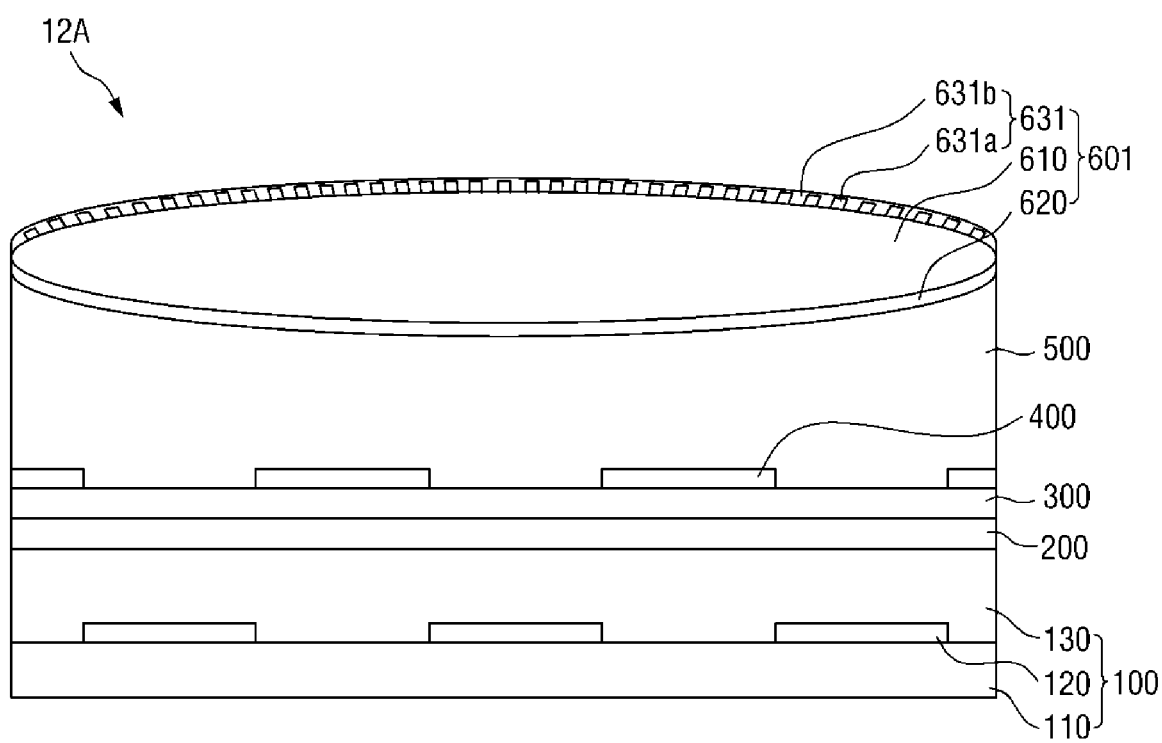
Figure 7B:
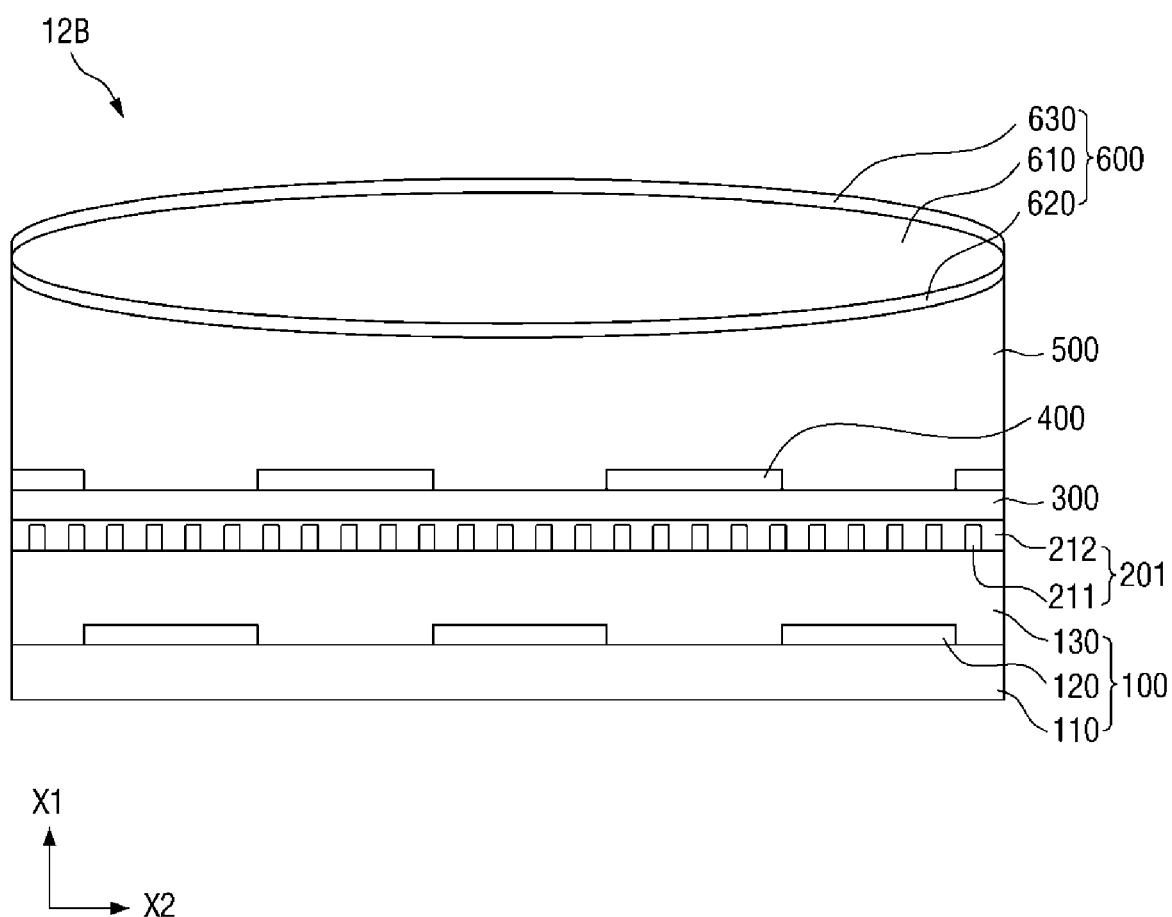
Figure 7C:
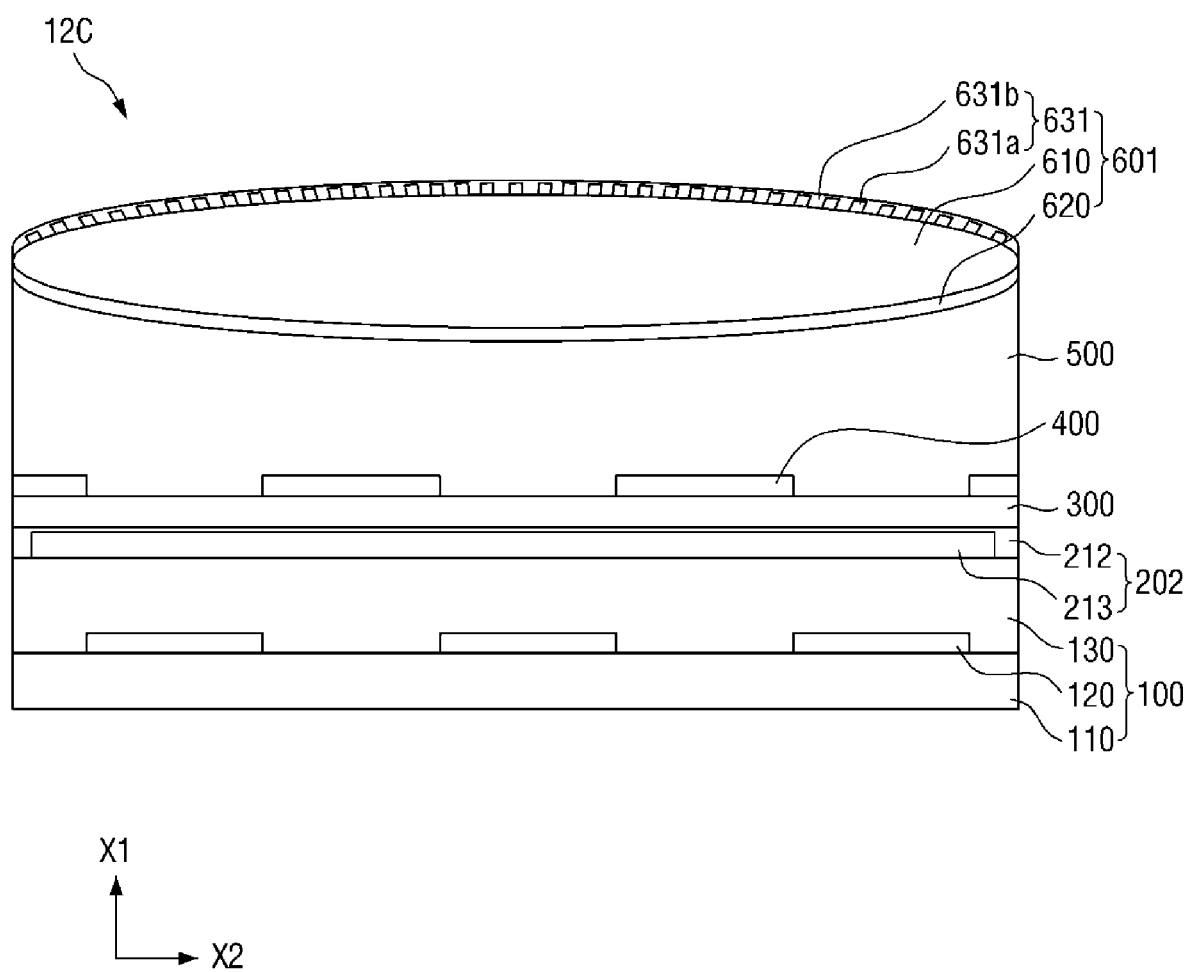

FIG. 7A, FIG. 7B, and FIG. 7C are cross-sectional views of head-mounted display devices according to other exemplary embodiments.

A head-mounted display device 12A shown in FIG. 7A differs from the head-mounted display device 10 shown in FIG. 1 in that a second polarizing layer 631 is implemented as a wire grid polarizer.

More detailed description thereof will be made with reference to FIG. 7A. The second polarizing layer 631 may include a plurality of first grid patterns 631a and a first capping layer 631b. The plurality of first grid patterns 631a may protrude from the lens 610 in the first direction X1.

The plurality of first grid patterns 631a may include, for example, aluminum, silver, copper, nickel, or the like. The plurality of first grid patterns 631a may be formed by nano-imprinting or the like.

The first capping layer 631b may be disposed over the plurality of first grid patterns 631a to cover them. The first capping layer 631b can suppress defects such as corrosion of the first grid patterns 631a and provide a flat top surface of the second polarizing layer 631.

A head-mounted display device 12B shown in FIG. 7B differs from the head-mounted display device 10 shown in FIG. 1 and the head-mounted display device 12A shown in FIG. 7A in that a first polarizing layer 201 is implemented as a wire grid polarizer.

Referring to FIG. 7B, the first polarizing layer 201 may include a plurality of second grid patterns 211 and a second capping layer 212. The plurality of second grid patterns 211 may protrude from the protective layer 130 in the first direction X1.

A head-mounted display device 12C shown in FIG. 7C differs from the head-mounted display device 10 shown in FIG. 1, the head-mounted display device 12A shown in FIG. 7A, and the head-mounted display device 12C shown in FIG. 7B in that a first polarizing layer 202 as well as a second polarizing layer 631 are implemented as wire grid polarizers.

Referring to FIG. 7C, the arrangement of the first polarizing layer 202 may be different from the arrangement of the first polarizing layer 201 shown in FIG. 7B. Specifically, both of the first polarizing layer 202 and the second polarizing layer 631 of the head-mounted display device 12C shown in FIG. 7C are implemented as wire grid polarizers, and thus the first polarizing layer 202 and the second polarizing layer 631 may be disposed so that the light having passed through the first polarizing layer 202 is polarized in a direction different from the direction in which the light having passed through the second polarizing layer 631 is polarized. In other words, the direction in which the plurality of second grid patterns 213 of the first polarizing layer 202 extends may be orthogonal to the direction in which the plurality of first grid patterns 631a of the second polarizing layer 631 extends.

Although not shown in the drawings, the head-mounted display devices 12A, 12B and 12C shown in FIGS. 7A, 7B, and 7C, respectively, may further include a planarization layer. The planarization layer may be disposed under the plurality of first grid patterns 631a and/or the plurality of second grid patterns 211 and 213 to provide a flat surface thereunder.

Figure 8:
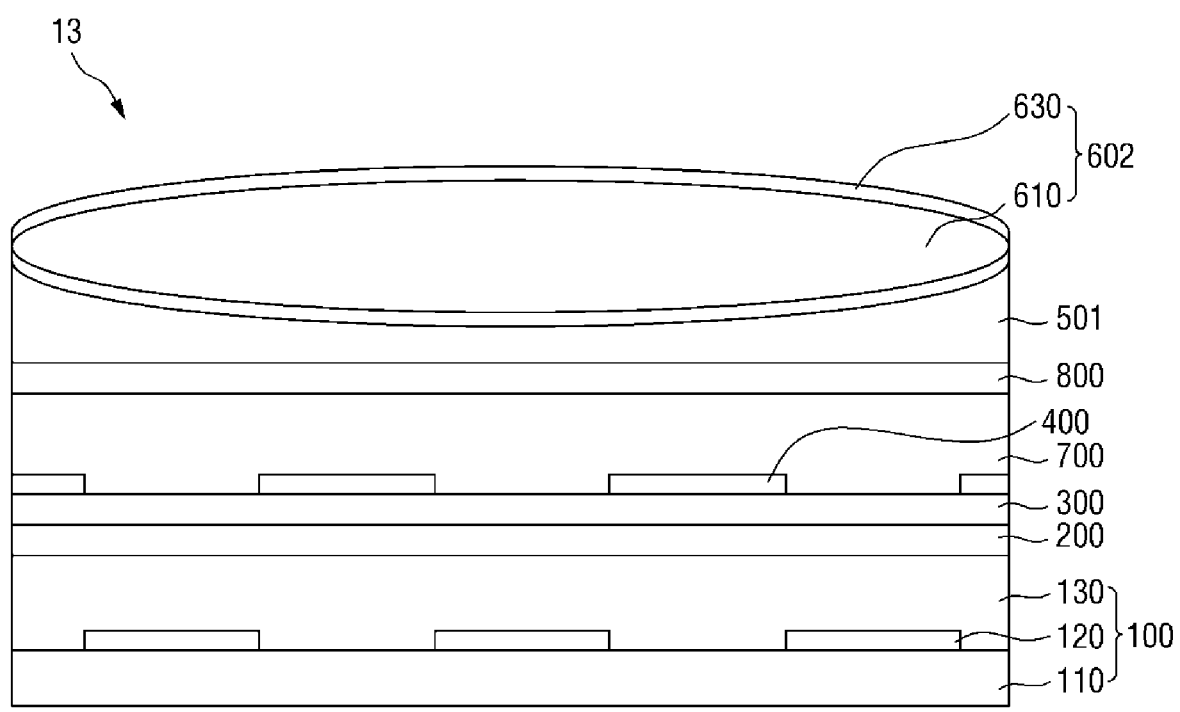

FIG. 8 is a cross-sectional view of a head-mounted display device according to still another exemplary embodiment.

A head-mounted display device 13 shown in FIG. 8 differs from the head-mounted display device 10 shown in FIG. 1 in that an optical unit 602 does not include a light-separating layer 800.

Referring to FIG. 8, the light-separating layer 800 may be disposed on a third buffer layer 700. The third buffer layer 700 will be described first. The third buffer layer 700 may be disposed between the light-separating layer 800 and the reflective layer 400. The material of the third buffer layer 700 is not particularly limited herein. For example, the third buffer layer 700 may include an inorganic material or an organic material. Alternatively, the third buffer layer 700 may have a single-layer structure of an organic layer or an inorganic layer or may have a multi-layer structure of organic layers and inorganic layers stacked on one another.

The third buffer layer 700 may also be eliminated. When the third buffer layer 700 is eliminated, the distance between the optical unit 602 and the display 100 can be adjusted by adjusting the thickness of the adhesive layer 501.

The light-separating layer 800 may be disposed between the third buffer layer 700 and the adhesive layer 501. The light-separating layer 800 may transmit some of the first polarized light that has passed through the first polarizing layer 200 and may reflect the rest. The light having passed through the light-separating layer 800 may be provided to the second polarizing layer 630 through the lens 610. On the other hand, the light reflected by the light-separating layer 800 may be provided back to the reflective layer 400.

Figure 9:
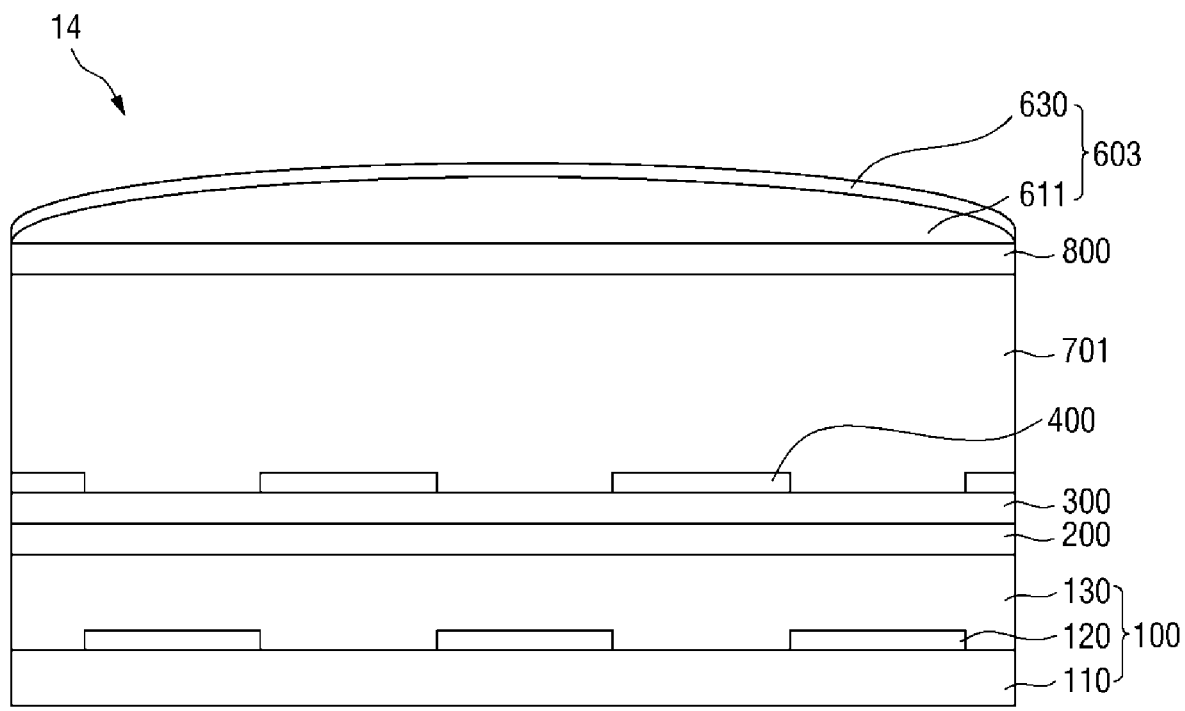
Figure 9:
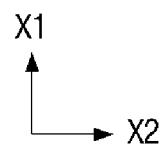

FIG. 9 is a cross-sectional view of a head-mounted display device according to another exemplary embodiment.

A head-mounted display device 14 shown in FIG. 9 differs from the head-mounted display device 10 shown in FIG. 1 in that an optical unit 603 does not include a light-separating layer 800, and that the optical unit 603 is attached to the light-separating layer 800 with no additional adhesive member. Moreover, a lens 611 included in the optical unit 603 is a polymer lens.

Referring to FIG. 9, the optical unit 603 may include a lens 611 and a second polarizing layer 630. The optical unit 603 may be disposed directly on the light-separating layer 800. In other words, no separate adhesive member is formed between the optical unit 603 and the light-separating layer 800.

The lens 611 may be, for example, a polymer lens. For example, the lens 611 may include polyimide (PI). Thus, the lens 611 includes a plastic component and can be produced more easily.

The second polarizing layer 630 may be formed as a film on the lens 611. In another exemplary embodiment, when the second polarizing layer 630 is implemented as a wire grid polarizer, the second polarizing layer 630 may be formed by being patterned directly on the lens 611.

As there is no adhesive member, the distance between the optical unit 602 and the display 100 can be adjusted by adjusting the thickness of the third buffer layer 701 or the first buffer layer 300. The third buffer layer 701 or the first buffer layer 300 may be eliminated.

Figure 10:
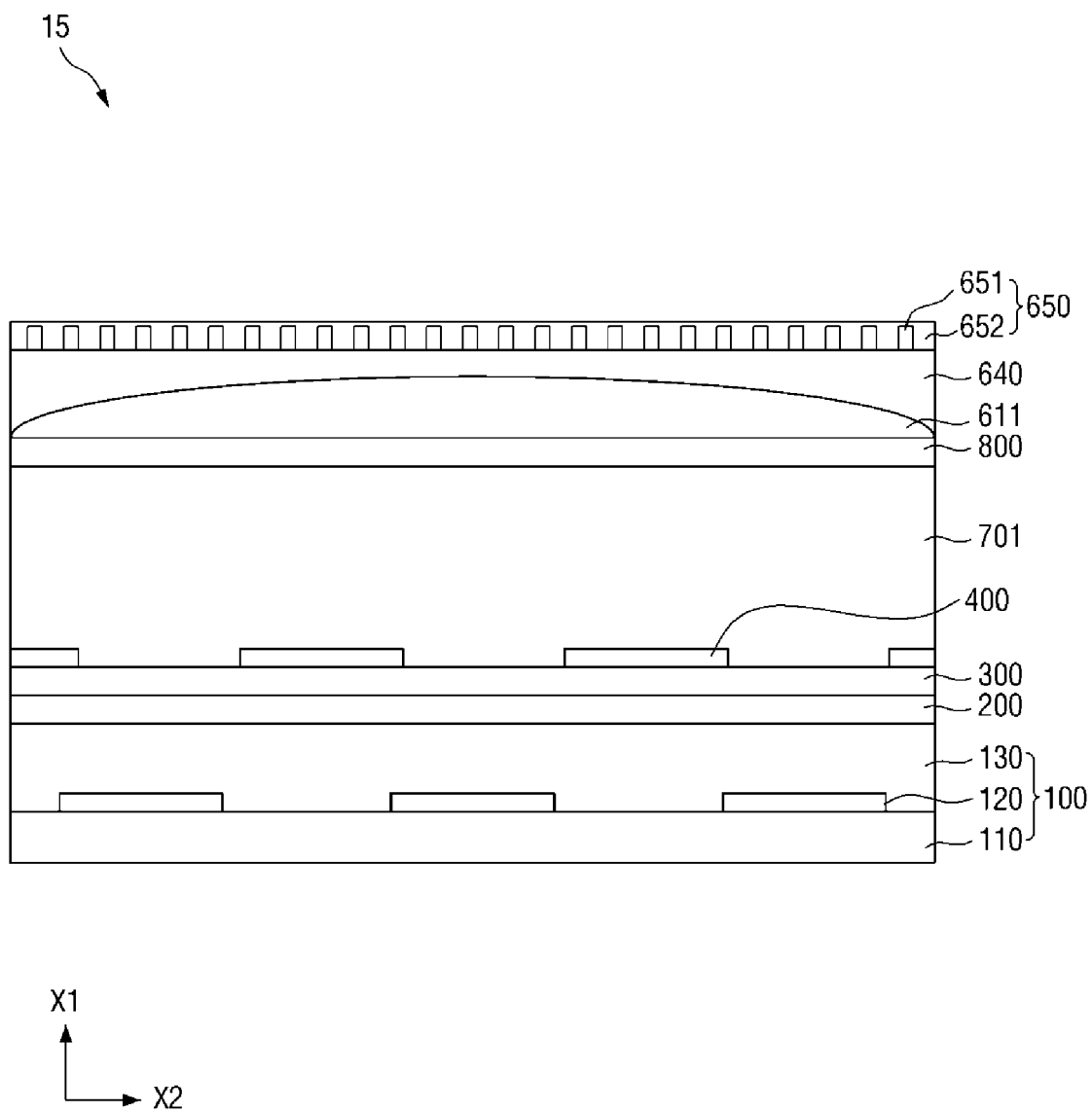

FIG. 10 is a cross-sectional view of a head-mounted display device according to still another exemplary embodiment.

The head-mounted display device 15 shown in FIG. 10 differs from the head-mounted display device 10 shown in FIG. 1 in that the optical unit includes a lens 611 only, that the optical unit does not include the light-separating layer 800, that a refraction matching layer 640 is disposed on the lens 611, that the lens 611 is a polymer lens, and that a second polarizing layer 650 is a wire grid polarizer.

Referring to FIG. 10, the refraction matching layer 640 may be disposed on the lens 611. The refractive index of the refraction matching layer 640 may be substantially equal to the refractive index of the lens 611. As used herein, the term "substantially equal" refractive index encompasses the refractive index being exactly equal and refractive indices being readily recognized by a person of ordinary skilled in the art as being equal although they are not exactly equal. Accordingly, the material of the refraction matching layer 640 is not particularly limited herein as long as the refractive index of the material approximates the refractive index of the lens 611.

The second polarizing layer 650 may be disposed on the refraction matching layer 640. The second polarizing layer 650 may include a plurality of second grid patterns 651 and a second capping layer 652. The plurality of second grid patterns 651 may protrude upwardly in the orientation of FIG. 10. The second capping layer 652 may be eliminated. Further, although not shown in the drawings, an additional planarization layer may be further disposed between the refraction matching layer 640 and the second polarizing layer 650 to provide a flat surface for the second grid pattern 651.

Although the second polarizing layer 650 is implemented as a wire grid polarizer in FIG. 10, this is merely illustrative. For example, the second polarizing layer 650 may be implemented as a film as shown in FIG. 1.

In addition, the distance between the lens 611 and the display 100 can be adjusted by adjusting the thickness of the third buffer layer 701 or the first buffer layer 300.

Figure 11:
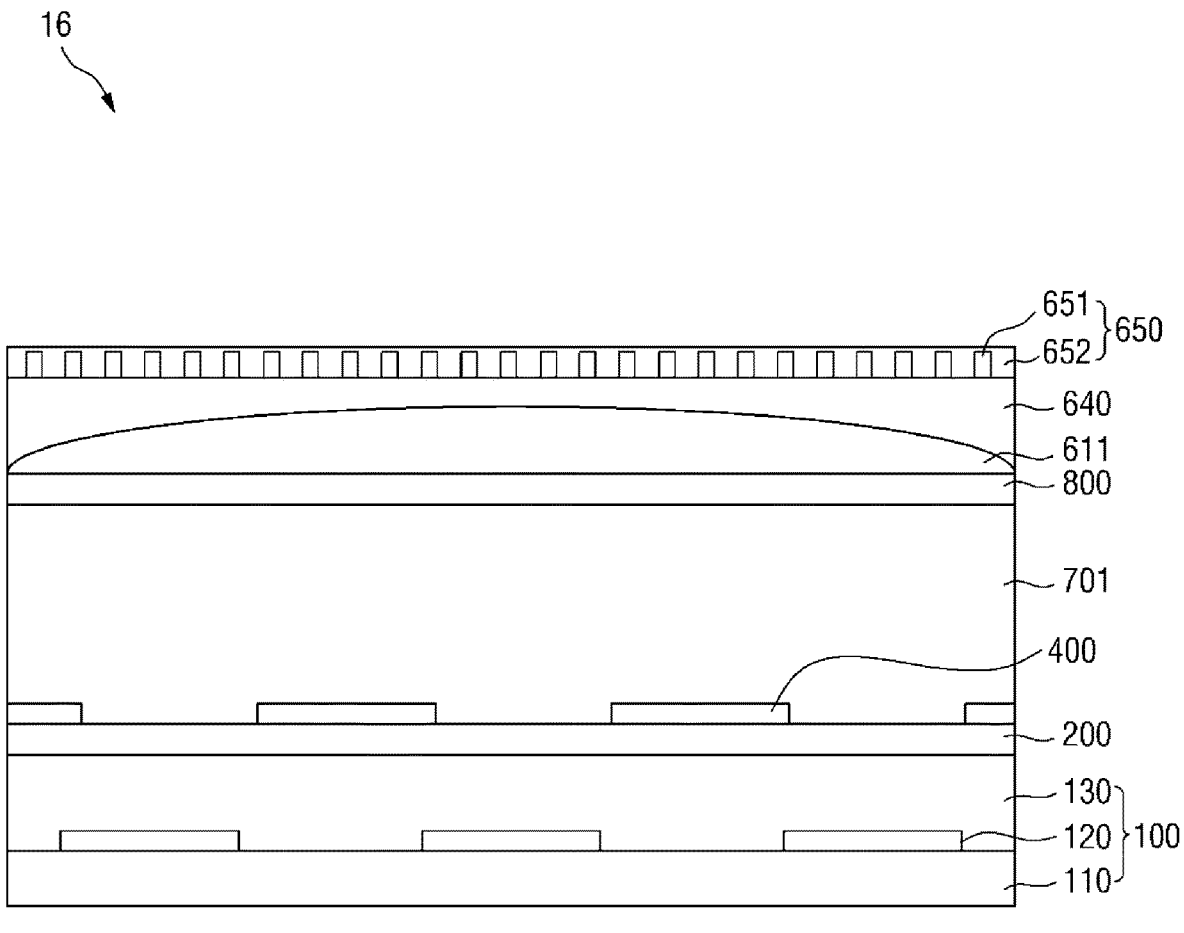

FIG. 11 is a cross-sectional view of a head-mounted display device according to still another exemplary embodiment.

A head-mounted display device 16 shown in FIG. 11 differs from the head-mounted display device 15 shown in FIG. 10 in that the first buffer layer 300 (see FIG. 10) is eliminated. Accordingly, the reflective layer 400 may be disposed directly on the first polarizing layer 200. When the first buffer layer 300 is eliminated, the distances among the display 100, the reflective layer 400 and the lens 611 can be controlled by adjusting the thickness of the third buffer layer 701.

It is to be noted that the first buffer layer 300 in each of the head-mounted display devices shown in FIGS. 1 and 7, 9, and 10 may also be eliminated.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A head-mounted display device, comprising:
a display comprising a substrate and a plurality of display elements disposed on the substrate;
a first polarizing layer disposed on the display;
a reflective layer disposed on the first polarizing layer;
a light-separating layer disposed on the reflective layer;
a lens disposed on the light-separating layer; and
a second polarizing layer disposed on a first surface of the lens,
wherein the light-separating layer is disposed between the reflective layer and the lens and is configured to transmit some of a first polarized light that has passed through the first polarizing layer and reflect a remainder of the first polarized light, and
wherein the light separating layer faces a second surface of the lens opposite the first surface.

2. The head-mounted display device of claim 1, further comprising an adhesive member disposed between the light-separating layer and the reflective layer.

3. The head-mounted display device of claim 1, further comprising:
a first buffer layer disposed between the reflective layer and the first polarizing layer,
wherein the first buffer layer comprises an inorganic material or an organic material.

4. The head-mounted display device of claim 3, further comprising:
a second buffer layer disposed between the light-separating layer and the reflective layer,
wherein the second buffer layer comprises an inorganic material or an organic material.

5. The head-mounted display device of claim 1, further comprising:
a protective layer disposed over the plurality of display elements.

6. The head-mounted display device of claim 5, wherein the plurality of display elements are a plurality of organic light-emitting display elements, and
wherein the protective layer is a glass insulating substrate or comprises at least one of an organic layer and an inorganic layer.

7. The head-mounted display device of claim 1, wherein at least one of the first polarizing layer and the second polarizing layer is a wire grid polarizer.

8. The head-mounted display device of claim 1, further comprising an adhesive member disposed between the light-separating layer and the lens.

9. The head-mounted display device of claim 1, wherein the lens is a polymer lens.

10. The head-mounted display device of claim 1, further comprising a refraction matching layer disposed between the second polarizing layer and the lens.

11. A head-mounted display device, comprising:
a display comprising a substrate and a plurality of display elements disposed on the substrate;
a first polarizing layer disposed on the display;
a reflective layer disposed on the first polarizing layer;
a light-separating layer disposed on the reflective layer;
a lens disposed on the light-separating layer; and
a second polarizing layer disposed on the lens,
wherein the reflective layer comprises a plurality of openings each at least partially overlapping with the respective display elements, and
wherein the reflective layer is disposed over an entire surface of the first polarizing layer except the plurality of openings.

12. A head-mounted display device, comprising:
a display comprising a substrate and a plurality of display elements disposed on the substrate;
a first polarizing layer disposed on the display;
a reflective layer disposed on the first polarizing layer; and
an optical unit comprising a light-separating layer disposed on the reflective layer, a lens disposed on the light-separating layer, and a second polarizing layer disposed on the lens,
wherein at least one of the light-separating layer and the second polarizing layer is in direct contact with the lens,
wherein the reflective layer comprises a plurality of openings each at least partially overlapping with the respective display elements, and
wherein the reflective layer is disposed over an entire surface of the first polarizing layer except the plurality of openings.

13. The head-mounted display device of claim 12, wherein at least one of the first polarizing layer and the second polarizing layer is a wire grid polarizer.

14. The head-mounted display device of claim 12, further comprising:
an adhesive member disposed between the reflective layer and the optical unit,
wherein the reflective layer is coupled with the optical unit by the adhesive member.

15. The head-mounted display device of claim 12, wherein the lens is a polymer lens.

16. The head-mounted display device of claim 12, comprising:
   a buffer layer disposed between the reflective layer and the first polarizing layer and/or between the reflective layer and the optical unit.

17. The head-mounted display device of claim 12, wherein the display further comprises a protective layer disposed over the plurality of display elements,
   wherein the display elements are organic light-emitting display elements, and the protective layer is an encapsulation layer.

* * * * *